United States Patent
Lee et al.

(10) Patent No.: US 9,496,358 B2
(45) Date of Patent: Nov. 15, 2016

(54) SEMICONDUCTOR DEVICE AND FABRICATION METHOD THEREFOR

(71) Applicant: INOTERA MEMORIES, INC., Taoyuan County (TW)

(72) Inventors: Tzung-Han Lee, Taipei (TW); Yaw-Wen Hu, Taoyuan County (TW); Neng-Tai Shih, New Taipei (TW); Heng Hao Hsu, New Taipei (TW); Yu Jing Chang, Taoyuan County (TW); Hsu Chiang, New Taipei (TW)

(73) Assignee: Inotera Memories, Inc., Taoyuan County (TW)

( * ) Notice: Subject to any disclaimer, the term of this patent is extended or adjusted under 35 U.S.C. 154(b) by 17 days.

(21) Appl. No.: 14/289,936

(22) Filed: May 29, 2014

(65) Prior Publication Data

US 2015/0349072 A1    Dec. 3, 2015

(51) Int. Cl.
*H01L 29/423* (2006.01)
*H01L 21/265* (2006.01)
*H01L 29/66* (2006.01)
*H01L 29/78* (2006.01)

(52) U.S. Cl.
CPC ..... *H01L 29/4236* (2013.01); *H01L 21/26586* (2013.01); *H01L 29/66621* (2013.01); *H01L 29/7834* (2013.01)

(58) Field of Classification Search
CPC .............. H01L 29/4236; H01L 21/26586; H01L 29/66621; H01L 29/7834
IPC .............. H01L 29/4236, 29/66621, 29/7834, H01L 21/26586
See application file for complete search history.

(56) References Cited

U.S. PATENT DOCUMENTS

| 6,063,694 A * | 5/2000 | Togo ................ H01L 21/76229 257/E21.548 |
| 2008/0070365 A1 | 3/2008 | Park |
| 2009/0020810 A1* | 1/2009 | Marchant ............ H01L 29/407 257/331 |
| 2012/0319193 A1* | 12/2012 | Hoelke ............ H01L 21/26586 257/330 |
| 2014/0167155 A1* | 6/2014 | Zundel ........... H01L 21/823487 257/334 |

FOREIGN PATENT DOCUMENTS

TW       201327656 A1    7/2013

\* cited by examiner

*Primary Examiner* — Phat X Cao
*Assistant Examiner* — Nga Doan
(74) *Attorney, Agent, or Firm* — Rosenberg, Klein & Lee

(57) ABSTRACT

A semiconductor electronic device structure includes a substrate having a trench disposed therein, a gate electrode disposed in the trench, and a gate dielectric layer disposed on the surface in the trench. The substrate and the gate electrode are electrically insulated from each other by the gate dielectric layer. The substrate further has a pair of doped areas. The doped areas each are vertically disposed along the two respective lateral sides of the trench. The doped areas each have a first portion and a second portion arranged atop the first portion. The first portion extends vertically to the portion of the substrate that is aligned to the gate electrode. The lateral dimension of the first portion is smaller than the lateral dimension of the second portion, and the doping concentration of the first portion is lighter than the doping concentration of the second portion.

5 Claims, 4 Drawing Sheets

SEMICONDUCTOR DEVICE AND FABRICATION METHOD THEREFOR

BACKGROUND

1. Field of the Invention

The instant disclosure relates to structural arrangement of semiconductor device and fabrication method thereof, and pertains particularly to a semiconductor device having trench gate and fabrication method thereof.

2. Description of Related Art

Channel length of a semiconductor device having trench gate is generally determined by the etch depth of the trench for a gate and the ion implantation depth of the source/drain area. The trench for a gate is conventionally formed by one-step etching of the semiconductor substrate. This may result in a large trench depth difference between the different sections (e.g. the center section and the edge section) of a semiconductor wafer, thus, the channel lengths of the semiconductor wafer are not uniform. That is to say, process uniformity is not easily controlled and there is a problem of channel length variation and/or gate length variation in the prior arts.

SUMMARY OF THE INVENTION

The embodiment of the instant disclosure provides a semiconductor device having trench gate and a method of fabricating the same capable of easily reducing the channel length variation.

The semiconductor electronic device structure in accordance with the instant disclosure comprise a substrate having a trench disposed therein, a gate electrode disposed in the trench, and a gate dielectric layer disposed on the surface in the trench. The substrate and the gate electrode are electrically insulated from each other by the gate dielectric layer. The substrate further has a pair of doped areas. The doped areas each are vertically disposed along the two respective lateral sides of the trench. The doped areas each have a first portion and a second portion arranged atop the first portion. The first portion extends vertically to the portion of the substrate that is aligned to the gate electrode. The lateral dimension of the first portion is smaller than the lateral dimension of the second portion, and the doping concentration of the first portion is lighter than the doping concentration of the second portion.

The embodiment of the instant disclosure further provides a semiconductor device having trench gate capable of reducing the capacitance between the gate and drain (Cgd) and/or gate-induced drain leakage.

Another aspect of the instant disclosure provides a fabrication method for a semiconductor electronic device structure, which comprises the following steps. First, a substrate having a trench disposed therein is provided. A gate dielectric layer is subsequently formed on the surface in the trench. And then, the trench is partially filled with electrode material for forming a gate electrode in the bottom of the trench, where the substrate and the gate electrode are electrically insulated from each other by the gate dielectric layer. A first angled implantation is then carried out to doping impurities into the substrate through the side walls in the partially filled trench with the gate electrode disposed therein. And then, the trench is partially filled with insulating material for forming an insulating cover layer disposed in the trench to cover the gate electrode. A second angled implantation is then carried out to doping impurities into the substrate through the side walls in the partially filled trench with both the gate electrode and the insulating cover layer disposed therein.

These and other features and advantages of the present invention will be described in, or will become apparent to those of ordinary skill in the art in view of the following detailed description of the exemplary embodiments of the present invention.

BRIEF DESCRIPTION OF THE DRAWINGS

The novel features believed characteristic of the invention are set forth in the appended claims, the invention itself, however, as well as a preferred mode of use, further objectives and advantages thereof, will best be understood by reference to the following detailed description of an illustrative embodiments when read in conjunction with the accompanying drawings, wherein:

DETAILED DESCRIPTION OF THE PREFERRED EMBODIMENTS

The instant disclosure will be described more specifically with reference to the following embodiments. It is to be noted that the following descriptions of preferred embodiments are provided herein for purpose of illustration and description. It is not intended to be exhaustive or limiting to the precise form disclosed.

Figure 1:
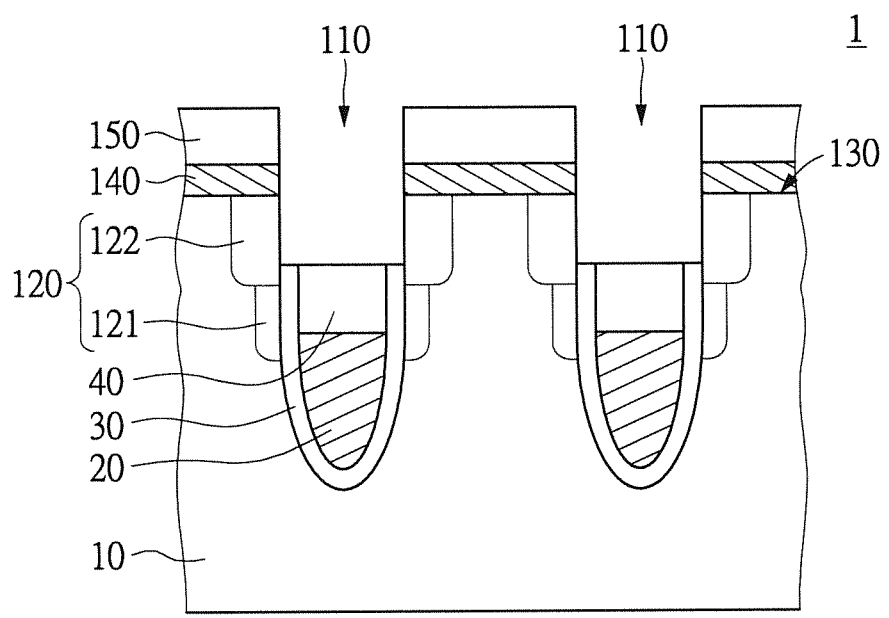
FIG. 1 illustrates a partial cross-sectional view of a semiconductor device structure in accordance with an embodiment of the instant disclosure.

Please refer to FIG. 1, which illustrates a partial cross-sectional view of a semiconductor electronic device structure in accordance with an embodiment of the instant disclosure. The semiconductor electronic device structure 1 comprises a substrate 10 having a trench 110 disposed therein, a gate electrode 20 disposed in the trench 110, and a gate dielectric layer 30 disposed on the surface in the trench 110. The substrate 10 and the gate electrode 20 are electrically insulated from each other by the gate dielectric layer 30. The substrate 10 further has a pair of doped areas 120. The doped areas 120 each are vertically disposed along the two respective lateral sides of the trench 110.

Moreover, the doped areas 120 each have a first portion 121 and a second portion 122 arranged atop the first portion 121. The first portion 121 extends vertically to the portion of the substrate 10 that is aligned to the gate electrode 20. The lateral dimension of the first portion 121 is smaller than the lateral dimension of the second portion 122, and the doping concentration of the first portion 121 is lighter than the doping concentration of the second portion 122. As shown in FIG. 1, the doped areas 120 each have a lateral profile that resembles the shape of an ear.

In the instant disclosure, the semiconductor electronic device structure 1 may further comprise an insulating cover layer 40 disposed in the trench 110 to cover the gate electrode 20, where the second portion 122 of each of the doped area 120 extends vertically to the portion of the substrate 10 that is aligned to the insulating cover layer 40.

Please refer to FIG. 2 to FIG. 6, where FIG. 2 to FIG. 6 each illustrate a partial cross-sectional view of the semiconductor device structure during one exemplary fabrication step. FIG. 2 to FIG. 6 show an exemplary process flow of fabricating a semiconductor electronic device structure having trench gate.

Figure 2:
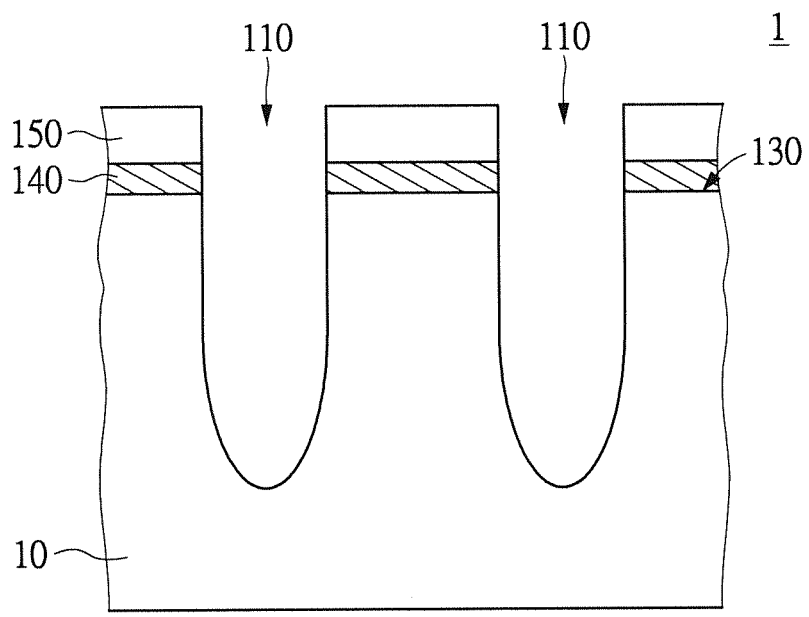
FIG. 2 to FIG. 6 each illustrate a partial cross-sectional view of the semiconductor device structure during one exemplary fabrication step.

As shown in FIG. 2, in the fabrication process of the semiconductor electronic device structure 1, a substrate 10 having a trench 110 therein is first provided. The substrate 10 has a major surface 130, and the trench 110 extends from the major surface 130 into the substrate 10.

The formation of the trench 110 may comprise: firstly, a trench etch mask (not shown in the Figures) is provided on the substrate 10. The substrate 10 is then etched using the trench etch mask as a shield. In the instant disclosure, the substrate 10 may further have a stack, which includes a silicon nitride layer 140 and an oxide layer 150, on the major surface 130. The stack can be used as a hard mask for trench etching.

Specifically, a photoresist pattern (not shown in the Figures) having an opening is formed on the stack by photolithography. The opening (not shown) is aligned with the location where the trench 110 is to be formed in the substrate 10. Using the photoresist pattern as a etch mask, the oxide layer 150 and the silicon nitride layer 140 are etched through the opening of the photoresist pattern to form a patterned hard mask followed by removing the photoresist pattern. Through the use of patterned hard mask as a shield, the etching process is carried out on the substrate, thereby forming the trench 110. The substrate 10 is etched by, for example, reactive ion etching (RIE) using an etching gas containing Cl2, HBr, O2, CF4 or SF6.

Preferably, the depth of the trench 110 (i.e., the vertical distance from the bottom inner surface of the trench 110 to the major surface 130 of the substrate 10, as shown in FIG. 2) may be about 150 nm. The substrate 10 may comprise silicon, gallium arsenide, gallium nitride, strained silicon, silicon germanium, silicon carbide, carbide, diamond, an epitaxy layer and/or other materials, and preferably is a silicon substrate.

Figure 3:
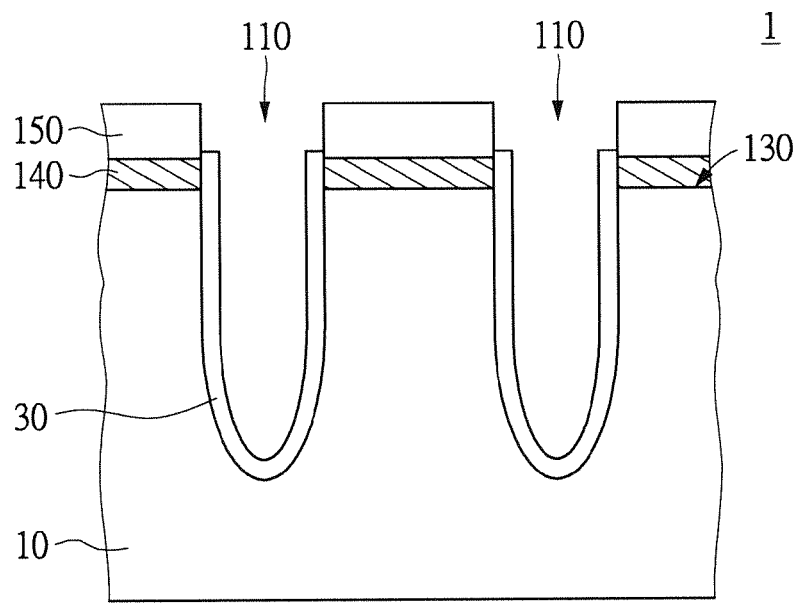

Next, please refer to FIG. 3. A gate dielectric layer 20, such as a silicon dioxide layer, is formed on the surface in the trench 110. Specifically, a thermal oxidation of the inner walls in the trench 110 is carried out for forming the gate dielectric layer 20. Alternatively, the gate dielectric layer 20 can also be formed by chemical vapor deposition (CVD) of silicon oxide, silicon nitride, silicon oxynitride, or titanium oxide.

Figure 4:
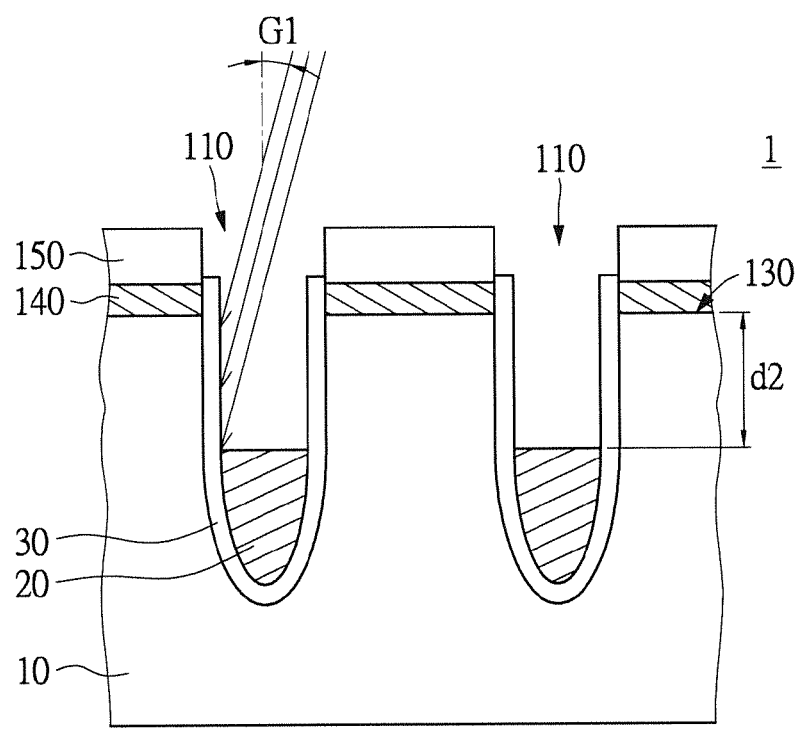

Please refer to FIG. 4. The trench 110 is then partially filled with electrode material for forming a gate electrode 30 in the bottom of the trench 110. Thus, the substrate 10 and the gate electrode 20 are electrically insulated from each other by the gate dielectric layer 30. The gate electrode 20 acts as a word line of the final device. It is worth noting that, the gate electrode 20 is disposed in the trench 110 with the top surface of the gate electrode 20 aligned below the major surface 130 of the substrate 10. Preferably, the depth of the gate electrode 20 (i.e., the vertical distance from the top surface of the gate electrode 20 to the major surface 130 of the substrate 10, as shown in FIG. 1) may be about 70 nm.

Specifically, the gate electrode 20 may be formed by first fully or partially filling the trench 110 with a conductive material. A step of etching back is then performed to selectively remove the conductive material down to a desired level in the trench 110 to accomplish the formation of the gate electrode 20 in the bottom portion of the trench 110. Alternatively, the trench 110 is partially filled with the conductive material in one step up to a desired level in the trench 110 for forming the gate electrode 20.

In the instant disclosure, the trench 110 is filled by deposition of the conductive material, and the deposition of the conductive material may be followed by the etching back step to leave the trench 110 in the partially filled state as shown in FIG. 4.

As a specific example, after the gate electrode 20 is formed in the bottom portion of the trench 110, only the portion of the gate dielectric layer 30 that is located above the top of the gate electrode 20 will be exposed. In some applications, it is preferable to carried out an etch process to remove the exposed portion of the gate dielectric layer 30.

Next, a first angled implantation with a low dose is carried out for lightly doping impurities into the substrate 10 through the side walls in the partially filled trench 110 with the gate electrode 20 disposed therein. The direction of the first angled implantation is represented by arrows in FIG. 4.

Typically, the first angled implantation step may include introducing impurity ions into the exposed gate dielectric layer 30 on the side wall in the trench 110 above the gate electrode 20, using an angled ionic source producing ion beams which is inclined to the side wall of the trench 110 at a first angle G1 relative to the vertical trench direction (i.e. the direction normal to the major surface 130). The first angle G1 may ranges from 5 to 15 degrees.

Figure 5:
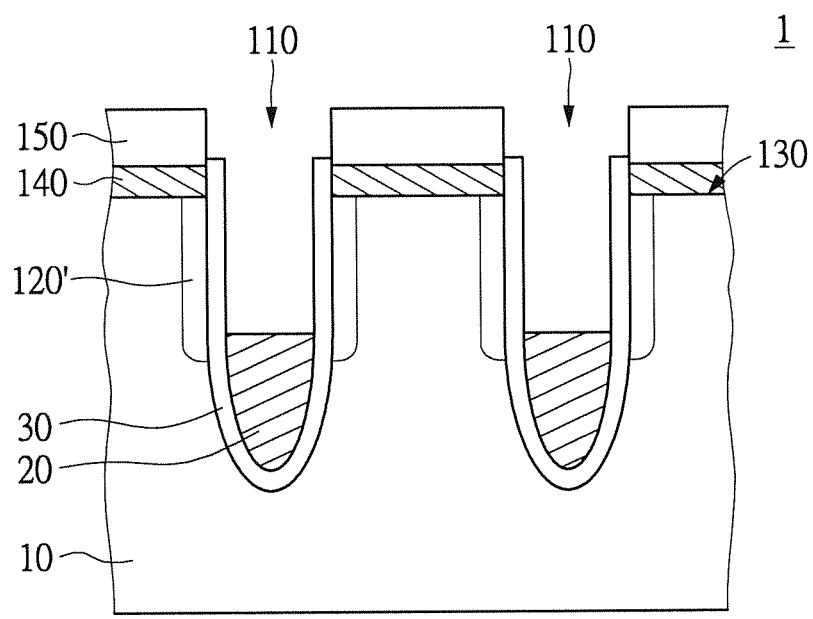

As a result shown in FIG. 5, a pair of initial doped areas 120' is formed in the substrate 10 adjacent to the respective lateral sidewalls of the trench 110. The initial doped areas 120' each extends vertically to the portion of the substrate 10 that is aligned to the gate electrode 20, and the initial doped areas 120' each has a lateral profile resembles the shape of a lobe. As mentioned above, the dose of the first angled implantation is low dose. Thus, the initial doped areas 120' formed exhibit light doping concentration. It is worth noting that, the bottom portions of the initial doped areas 120' can act as first portions 121 of doped areas 120 (FIG. 1), which will be discussed in detail later.

It is worth noting that, the conductive material for forming the gate electrode 20 is etched back before the first angled implantation step. Hence, the depth level of the etched-back conductive material in the trench (the gate electrode 20) can be used to define the vertical dimension of the initial doped area 120' (i.e. the vertical dimension of the first portion 121 of the doped area 120 as shown in FIG. 1). This ensures that the implant does not extend to the full depth of the trench 110. In the instant disclosure, the bottom of the doping profile of the initial doped area 120' can be slightly lower to the upper surface of the gate electrode 20.

In addition, the first angled implantation with low dose allows the initial doped area 120' to have a very narrow lateral spread. Thus, the need to etch the side wall to narrowing the lateral dimension of the doped area is omitted. This is highly advantage where trenches must be placed adjacent and as close as possible to one another to allow a particularly high device density.

Figure 6:
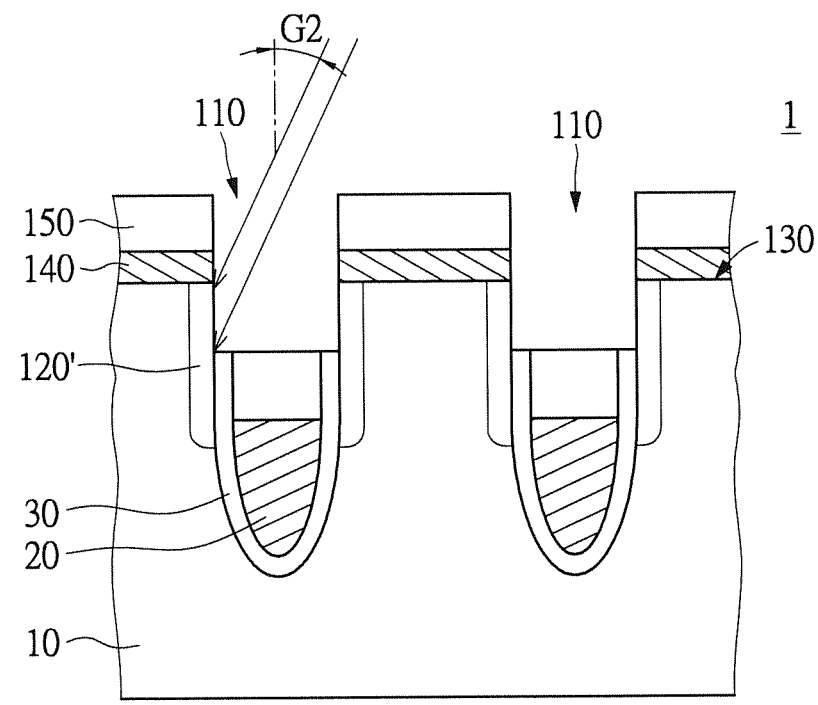

Next, please refer to FIG. 6. The trench 110 is then partially filled with insulating material for forming an insulating cover layer 40 disposed in the trench 110 to cover the gate electrode 20. The insulating cover layer 40 is formed on the top surface of the gate electrode 20 within the trench 110 and below the major surface 130 of the substrate 10. That is, the upper surface of the insulating cover layer 40 is below the major surface 130 within the trench 110 to expose a portion of the gate dielectric layer 30 in the trench 110. Preferably, the depth of the insulating cover layer 40 (i.e., the vertical distance from the top surface of the insulating cover layer 40 to the major surface 130 of the substrate 10, as shown in FIG. 1) may be about 30 nm.

Specifically, the formation of the insulating cover layer 40 may comprise: firstly, fully or partially filling the trench 110 with an insulating material, and then performing an etching back process to selectively remove the insulating material down to a desired level in the trench 110 to accomplish the formation of the insulating cover layer 40 in the trench 110. In some applications, it is preferable to remove the exposed portion of the gate dielectric layer 30 during the above etching back process.

In the instant disclosure, the trench 110 is filled by performing a blanket deposition of the insulating material, and the deposition of the insulating material may be followed by the etching back step to leave the trench 110 in the partially filled state as shown in FIG. 6. The entirety of the insulating cover layer 40 is arranged below the major surface 130 within the trench 110 to expose the portion of the surface in the trench 110 that is located above the top of the insulating cover layer 40.

Next, a second angled implantation with a high dose is carried out for heavily doping impurities into the substrate 10 through the side walls in the partially filled trench 110 with the gate electrode 20 and the insulating cover layer 40 disposed therein. The direction of the second angled implantation is represented by arrows in FIG. 6.

In this step, an angled implantation is again used to inject impurity ions into the side wall in the trench 110, where the insulating cover layer 40 is used to define the vertical dimension of implantation area. This can be realized by optimally matching the implant angle and the thickness of the insulating cover layer 40.

In an exemplary embodiment, the second angled implantation step may include introducing impurity ions into the side wall in the trench 110 above the insulating cover layer 40, using an angled ionic source producing ion beams which is inclined to the side wall of the trench 110 at a second angle G2 relative to the vertical trench direction. The second angle G2, which may ranges from 7 to 25 degrees, is greater than the first angle G1.

As a result shown in FIG. 1, a pair of the doped areas 120 is formed in the substrate 10 adjacent to the respective lateral sidewalls of the trench 110, where the doped areas 120 each include the first portion 121 and the second portion 122. The second portions 120 each extend vertically to the portion of the substrate 10 that is aligned to the insulating cover layer 40. As mentioned above, the dose of the second angled implantation is high dose, which is greater than that of the first angled implantation. Thus, the second portions 122 formed exhibit heavy doping concentration, which is greater than that of the initial doped areas 120'. Moreover, the lateral dimensions of the second portions 122 are greater than that of the initial doped areas 120'.

It is worth noting that, the insulating material for forming the insulating cover layer 40 is etched back before the second angled implantation step. Hence, the depth level of the etched-back insulating material in the trench 110 (the insulating cover layer 40) can be used to define the vertical dimension of the second portion 122 of the doped area 120 (as shown in FIG. 1). This ensures that the heavily doped implanting does not extend to the full depth of the gate electrode 20. In the instant disclosure, the bottom of the doping profile of the second portion 122 can be slightly lower to the upper surface of the insulating cover layer 40.

In addition, the second angled implantation allows the second portion 122, which exhibit heavier doping concentration, to have a wider lateral spread with a consequently lower junction resistance.

The formation of the doped area 120, which includes the first doped area 121 and the second doped area 122 atop the first portion 121, is generally complete upon the second angled implantation, where the lateral dimension of the first portion 121 is smaller than the lateral dimension of the second portion 122, and the doping concentration of the first portion 121 is lighter than the doping concentration of the second portion 122.

The first portion 121 extends vertically to the portion of the substrate 10 that is aligned to the gate electrode 20, and the depth of the first portion 121 and the depth of the second portion 122 have a depth difference.

The lateral dimension and the vertical dimension of the first portion 121 of the doped area 120 are mainly determined by the step of the first angled implantation, which carried out after the formation of the gate electrode 20, where the depth level of the gate electrode 20 is below the major surface 130 of the substrate 10. The lateral dimension and the vertical dimension of the second portion 122 of the doped area 120 are mainly determined by the step of the second angled implantation, which is carried out after the formation of the insulating cover layer 40, where the depth level of the insulating cover layer 40 is smaller than that of the gate electrode 20. Thus, the word line coupling is easily controlled and the GIDL (gate induced drain leakage) can be reduced, even in a device with trench depth variation. Meanwhile, the cross-talk link between the adjacent junctions is also controlled, and the junction resistance can be decreased.

According to an embodiment of the invention, the channel length can be easily controlled and adjusted, thus the channel lengths of the cell units in the semiconductor wafer become more uniform.

Figure 7:
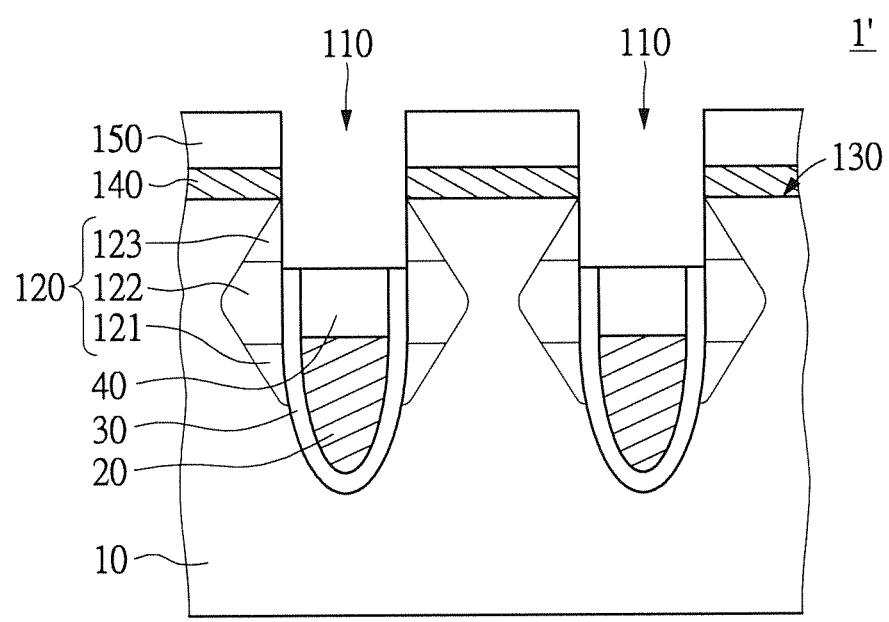
FIG. 7 illustrates a partial cross-sectional view of the semiconductor device structure in accordance with another embodiment of the instant disclosure.

Please refer to FIG. 7, which illustrates a partial cross-sectional view of the semiconductor device structure in accordance with another embodiment of the instant disclosure. As show in FIG. 7, in the semiconductor electronic device structure 1' in accordance with another embodiment of the instant disclosure, each of the doped area 120 further comprises a third portion 123 arranged atop the second portion 122. The lateral dimension of the third portion 123 is smaller than the lateral dimension of the second portion 122, and the doping concentration of the third portion 123 is lighter than the doping concentration of the second portion 122. In the instant disclosure, the doped areas 120 can each have a lateral profile that resembles the shape of a triangle.

This can be realized by carrying out a blanket implantation to doping impurities into the substrate 10, where the dose of the blanket implantation is lighter than the dose of the second angled implantation. To put it concretely, a blanket implantation is carried out over the entire major surface 130 of the substrate 10 and into the trench 110. This is a vertical implant at an angle directly perpendicular to the plane defined by the major surface 130.

In the instant disclosure, the blanket implantation is carried out before the step of carrying out the first angled implantation. Alternatively, in another embodiment, the blanket implantation may be carried out after the step of carrying out the second angled implantation.

In accordance with the instant embodiment, the present disclosure also provides a semiconductor electronic device structure and a method for fabricating the same. In the semiconductor electronic device structure 1, and 1', the doped area 120 has at least two portions, which are vertically arranged with one another, with different doping concentrations and different lateral widths. Through this configuration of the doping profile, the gate induced drain leakage can be reduced without word line coupling, even in a device with trench depth variation. Meanwhile, the junction resistance can be decreased without cross-talk link between the adjacent junctions. In addition, the vertical arrangement of the doped area 120 may enable the semiconductor electronic device to resume a smaller physical dimension.

In the fabrication method of a semiconductor electronic device structure, at least two angled implantation steps could be required, where one is for forming a first portion 121 of the doped area 120 of light dosage with a narrow lateral spread and extending to the depth of the gate electrode 20, and the other is for forming a second portion 122 of the doped area 120 of heavy dosage with a wide lateral spread and extending only to the depth of the insulating cover layer 40 atop the gate electrode 20. The spread of the doping can be accurately controlled and can be made to have a lateral profile resembling the shape of an ear. In addition, the resulting doped area 120 can be utilized in a wide variety of semiconductor devices with a trench gate.

While the invention has been disclosed with respect to a limited number of embodiments, numerous modifications and variations will be appreciated by those skilled in the art. It is intended, therefore, that the following claims cover all such modifications and variations that may fall within the true sprit and scope of the invention.

What is claimed is:

1. A fabrication method of a semiconductor electronic device structure having trench gate, comprising steps of:
    providing a substrate having a trench disposed therein;
    forming a gate dielectric layer on the surface in the trench;
    partially filling the trench with electrode material for forming a gate electrode in the bottom of the trench, wherein the substrate and the gate electrode are electrically insulated from each other by the gate dielectric layer;
    carrying out a first angled implantation to dope impurities into the substrate through the side walls in the partially filled trench with the gate electrode disposed therein to form a first portion;
    partially filling the trench with insulating material for forming an insulating cover layer disposed in the trench to cover the gate electrode;
    carrying out a second angled implantation to dope impurities into the substrate through the side walls in the partially filled trench with both the gate electrode and the insulating cover layer disposed therein to form a second portion, wherein the dose of the second angled implantation is higher than the dose of the first angled implantation.

2. The fabrication method of a semiconductor electronic device structure of claim 1,
    wherein the step of carrying out the first angled implantation comprises:
    introducing an ion beam to the side walls of the trench at a first angle relative to the vertical direction of extension of the trench;
    wherein the step of carrying out the second angled implantation comprises:
    introducing an ion beam to the side walls of the trench at a second angle relative to the vertical direction of extension of the trench; and
    wherein the first angle is smaller than the second angle.

3. The fabrication method of a semiconductor electronic device structure of claim 2, wherein the first angle ranges from 5 to 15 degrees and the second angle ranges from 7 to 25 degrees.

4. The fabrication method of a semiconductor electronic device structure of claim 1, further comprising the step of:
    carrying out a blanket implantation to doping impurities into the substrate, wherein the dose of the blanket implantation is lighter than the dose of the second angled implantation.

5. The fabrication method of a semiconductor electronic device structure of claim 1, further comprising the step of:
    carrying out a blanket implantation to dope impurities into the substrate to form a third portion;
    wherein the third portion is arranged atop the second portion;
    wherein the first, the second and the third portions are connected with each other to form a triangular doped area.

* * * * *